United States Patent [19]
Palara et al.

[11] Patent Number: 5,189,317
[45] Date of Patent: Feb. 23, 1993

[54] CIRCUIT FOR LIMITING THE OUTPUT VOLTAGE OF A MONOLITHIC SEMICONDUCTOR POWER DEVICE WHICH DRIVES A RESONANT LOAD CONNECTED TO A POWER SUPPLY

[75] Inventors: Sergio Palara, Acicastello; Mario Paparo, S. Giovanni la Punta; Roberto Pellicanó, Reggio Calabria, all of Italy

[73] Assignee: SGS-Thomson Microelectronics, Milan, Italy

[21] Appl. No.: 600,870

[22] Filed: Oct. 22, 1990

[30] Foreign Application Priority Data
Oct. 24, 1989 [IT] Italy ................. 22104 A/89

[51] Int. Cl.⁵ ............................. H03K 5/153
[52] U.S. Cl. ...................... 307/350; 307/354; 307/358; 307/359; 307/360
[58] Field of Search ............ 307/350, 354, 358, 359, 307/360

[56] References Cited

U.S. PATENT DOCUMENTS

| | | | |
|---|---|---|---|
| 4,241,309 | 12/1980 | Elder | 307/358 |
| 4,376,266 | 3/1983 | Raffoux | 307/359 |
| 4,471,237 | 9/1984 | Kaplan | 307/443 |
| 4,679,112 | 7/1987 | Craig | 361/33 |

FOREIGN PATENT DOCUMENTS 0150366  7/1985  European Pat. Off. .

Primary Examiner—Paul M. Dzierzynski
Assistant Examiner—R. A. Ratliff
Attorney, Agent, or Firm—Griffin Butler Whisenhunt & Kurtossy

[57] ABSTRACT

A limiting circuit comprises a comparator (B), which makes a comparison between the output voltage (Vc) of a power device and a predetermined reference voltage (Vrif). In the case wherein the output voltage is just below the reference voltage, the comparator supplies a current to the load (L) suitable for preventing the output voltage from falling further below the reference voltage.

15 Claims, 7 Drawing Sheets

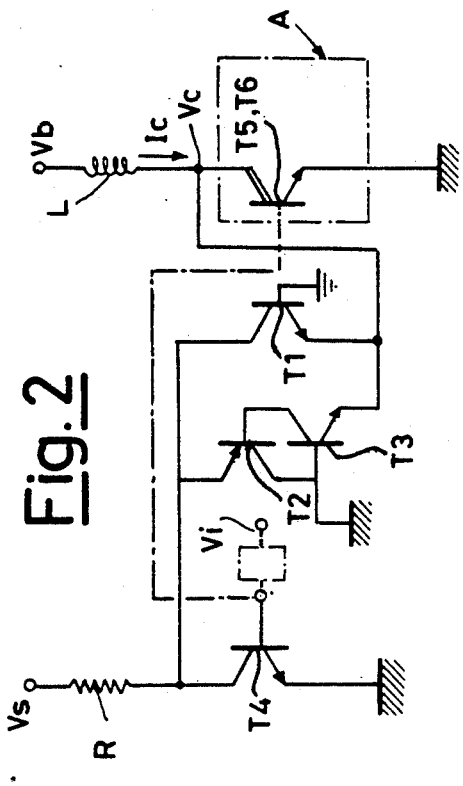
Fig.1
Fig.2
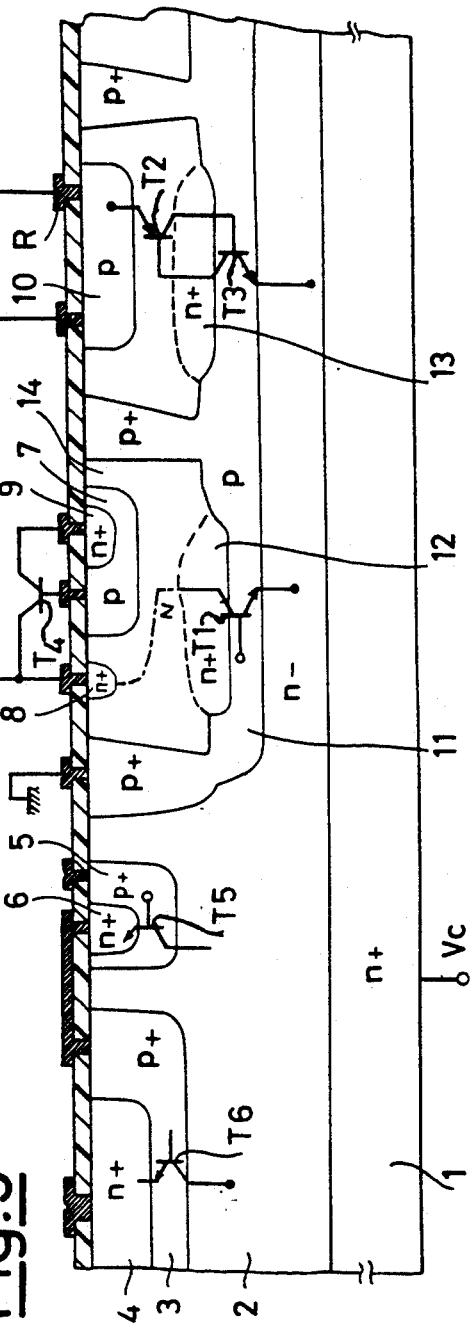
Fig.3

CIRCUIT FOR LIMITING THE OUTPUT VOLTAGE OF A MONOLITHIC SEMICONDUCTOR POWER DEVICE WHICH DRIVES A RESONANT LOAD CONNECTED TO A POWER SUPPLY

BACKGROUND

I. Field of the Invention

The present invention elates to a circuit for limiting the output voltage of a monolithic semiconductor power device which drives a resonant load connected to a power supply.

II. Prior Art and Other Considerations

For driving resonant loads, such as an ignition coil or a transformer, use is made of a semiconductor power device, say, of the darlington type, which is periodically switched on and off by means of a control circuit operated by an appropriate input signal.

The power device in substance operates like a switch that is opened or closed by the input signal provided by the control circuit.

When the switch is closed, a current flows through the load. When the switch is opened, a positive overvoltage is established between the load and the switch followed by a series of negative voltage peaks which depend on the parasitic capacities of the load and on how the energy, which is stored in the load itself during the switch's closing step, is discharged. Such negative voltage peaks can bring the output voltage of the power device below ground by several volts.

In the case wherein the control circuit and the power device are accomplished in the form of an integrated circuit, parasitic components are associated with the active components of the control circuit which, when the above voltage falls below ground, enter into conduction and shortcircuit the active components of the control circuit and jeopardize the operation of the same.

The object of the present invention is to prevent the output of the power device, that is, its collector connected to the load, from going to a negative voltage with respect to ground thus triggering the parasitic components.

SUMMARY

According to the invention such object is attained with a circuit for limiting the output voltage of a monolithic semiconductor power device which drives a resonant load connected to a power supply. The circuit comprises a comparator suitable for making the comparison between the output voltage and a predetermined reference voltage and, in the case wherein said output voltage were to be just below said reference voltage, for supplying current to the load so as to maintain the output voltage at a value approximately equal to said reference voltage.

In this way the negative voltage peaks on the collector of the power device are avoided ensuring the operation of the control circuit.

BRIEF DESCRIPTION OF THE DRAWINGS

The features of the present invention shall be made more evident by the following detailed description of its embodiments, illustrated as a non-limiting example in the enclosed drawings, wherein:

FIG. 1 shows a diagram of the control circuit and of the power device with its corresponding driven load;

FIG. 2 shows a partial circuit embodiment of the circuit diagram shown in FIG. 1;

FIG. 3 is an example of an embodiment in the form of an integrated circuit of part of the control circuit and of the power device;

With reference to FIG. 1, a load L, in particular a transformer, connected to a node at a voltage Vb of a battery is driven by a power device, in particular a switch A, which is opened and closed by an input signal Vi provided by a control circuit C supplied with a voltage Vs. With Vc there is indicated the output voltage of the power device.

With reference to FIG. 2, the power device A is accomplished in a circuit form such as a darlington T5, T6. Moreover, control circuit C comprises, among other things, a transistor T4 in series with a resistor R.

With reference to FIG. 3, the accomplishment in a monolithic integrated form of the circuit illustrated in FIG. 2 provides for a substrate with n+ doping, region 1, connected to the voltage Vc, inside which there are obtained transistors T5, T6 of the power darlington A, both of the npn type, whose collectors, bases, emitters occupy regions 2, 5, 6 and 2, 3, 4, respectively. Inside region 1 there is also obtained the control device C of the power device A, in particular the transistor T4 of the npn type, whose base, collector, emitter occupy regions 7, 8, 9 and whose collector, region 8, is connected to resistance R, region 10 of the p type, which in turn is connected to the power supply Vs.

Figure 4:
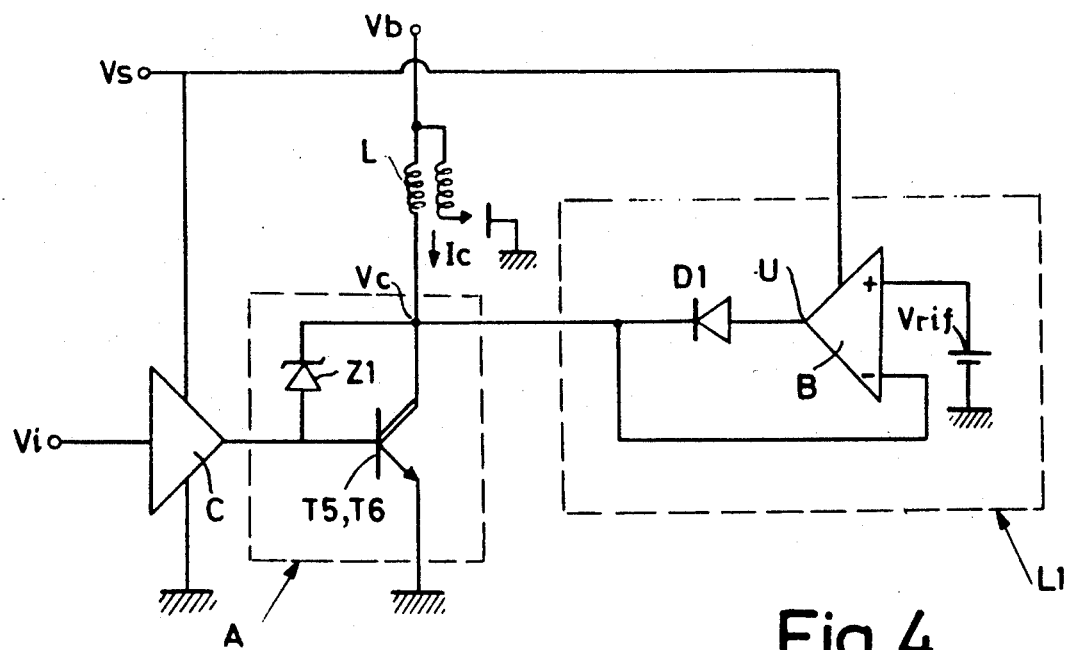
FIG. 4 is a circuit embodiment of the control circuit and of the power device with an associated limiting circuit according to the invention.

The monolithic accomplishment illustrated above determines the presence of a first parasitic transistor T1, whose base is accomplished in a region 11 of the pwell type, while the collector is accomplished in a region 12 of the n+ type and is connected to region 8 which constitutes the collector of transistor T4, and the emitter is accomplished in region 2 of the n- type.

There are also present a second and a third parasitic transistor T2, T3. The base of transistor T2 is connected to the collector of transistor T3, obtained in a region 13 of the n+ type, the emitter is accomplished in the region 10 of the p type, the collector is connected to the base of transistor T3, region 11 of the pwell type, lastly the emitter of transistor T3 is accomplished inside region 2 of the n- type.

The circuit connection of parasitic transistors T1, T2, T3 is indicated in FIG. 2.

With reference to FIG. 4, which represents the schematic diagram of the present invention, the power device A, accomplished by means of a pair of transistors T5, T6 in a darlington configuration, is driven on the base by control circuit C, kept on or off by means of input signal Vi. The emitter of the power device is grounded, the collector is connected to a load L, in particular a coil or a transformer. Between the collector and the base of the power device there is a voltage limiter, in particular a zener Z1. To the collector of the power device there is associated a circuit L1 limiting the output voltage corresponding to it. The limiting circuit L1 comprises a comparator B, which at its non-inverting input has a voltage Vrif, while its inverting input is supplied with the voltage Vc. A diode D1 is placed between the output U of comparator B and the voltage node Vc.

Figure 5:
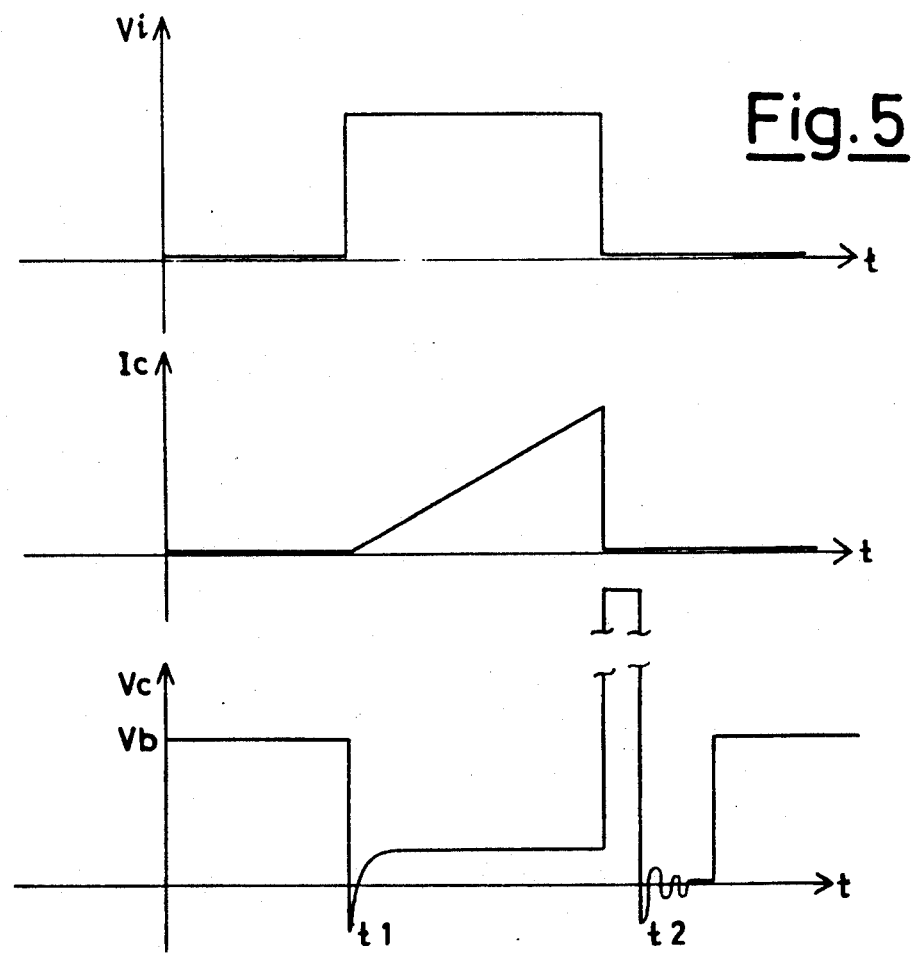
FIG. 5 illustrates the curves of the input signal, of the output voltage and of the collector current of the power device.

With reference to FIGS. 4, 5, in the absence of the limiting device according to the invention, that is, in the configuration of FIG. 2, the circuit operates as follows:

Assume that the main device consisting of the control device C and of the power device T5, T6 drives a load L, in the specific case the primary of a transformer. Initially Vi=0, T5, T6 is off and Vc=Vb.

When a positive voltage step of an amplitude such as to cause the conduction of T5 and T6 is applied to the node at voltage Vi, at the voltage node Vc there shall be exhibited a voltage peak which is negative with respect to ground and subsequently Vc goes to a voltage equal to the saturation voltage Vcesat of T5, T6, while a linearly rising current flows through winding L.

When a quenching signal is sent to the node at voltage Vi, darlington T5, T6 interdicts itself and there shall be an overvoltage on Vc whose maximum value is controlled by Zener Z1. Subsequently there is the discharge on the secondary of the transformer and Vc falls quickly below ground with some negative peaks, before positioning itself at Vb.

The addition of the limiting device L according to the invention (FIG. 4) allows the avoidance of the negative voltage peaks Vc at instants t1 and t2. In particular comparator B is switched on when Vc is less than or equal to Vrif and supplies to the node at a voltage Vc the current necessary to avoid the undesired voltage peaks.

Figure 6:
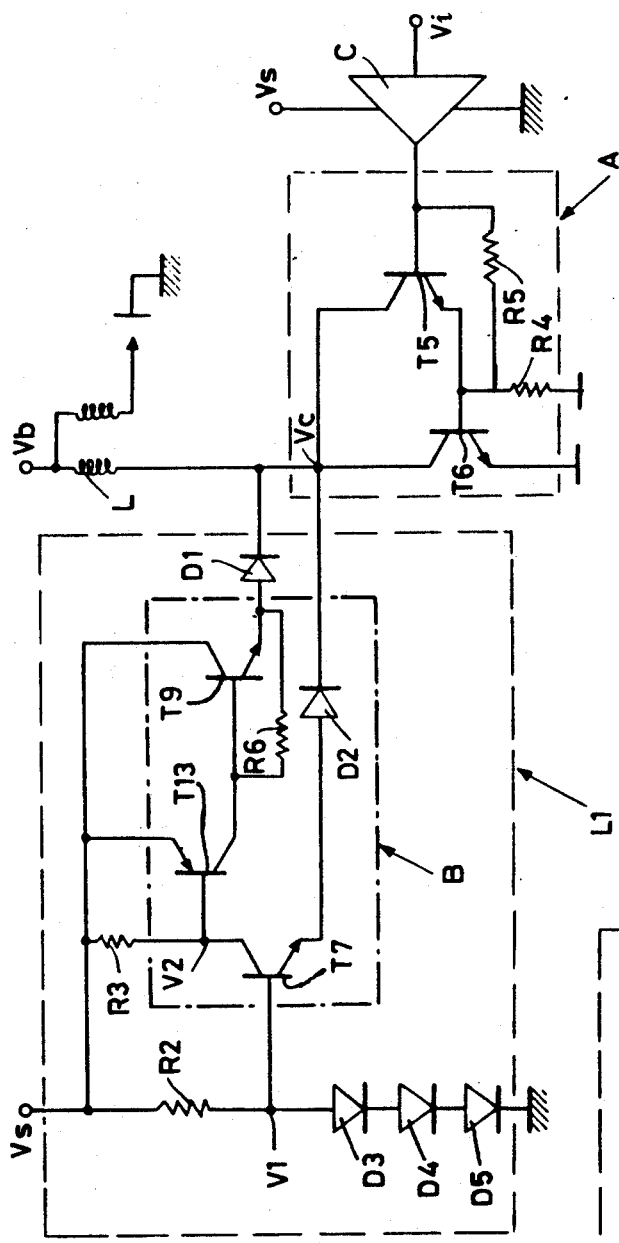
FIGS. 6, 7 and 8 illustrate alternative examples of circuit embodiments of the circuit according to the invention.

There is illustrated in FIG. 6 a first circuit embodiment of the limiting circuit according to the invention. According to such embodiment, provision is made for the introduction of a series of three diodes D3, D4, D5 between ground and a node at a voltage V1, which is in turn connected to the power supply Vs through a resistance R2. The node V1, which constitutes the input at the reference voltage of comparator B, is then connected to the base of a transistor T7, whose emitter is connected to a diode D2 and whose collector is connected to a resistor R3 in turn connected to the power supply Vs. An intermediate node V2, between the collector of transistor T7 and resistor R3, is connected to the base of a transistor T13, whose emitter is connected to the power supply Vs and whose collector is connected to the base of a transistor T9. The collector of transistor T9 is connected to the power supply Vs and the emitter to diode D1; in addition, between the base and the emitter of transistor T9 there is a resistor R6.

It can be deduced from the circuit diagram that V1=3 Vbe, where Vbe is the voltage of each diode D3, D4, D5. Since V1−Vc =Vbe(T7)=Vbe(D2), as soon as Vc tends to fall below Vbe T7 is switched on which switches on T13 and T9; the latter causes a current to flow through D1 which is not limited on Vc thus preventing the collector of darlington T5, T6 from falling below Vbe with respect to ground.

This circuit is conservative since to avoid switching on the parasitic components T1, T2, T3 of FIG. 3 it is sufficient to prevent Vc from falling below ground by a voltage whose absolute value is greater than or equal to Vbe. Thus voltage V1 could be constituted by 2 Vbe. In this case the circuit according to the invention becomes active when Vc is less than or equal to 0.

However, in the circuit of FIG. 6 it is preferred to have V1=3 Vbe since, apart from the negative voltage peaks, Vc is always greater than or equal to Vcesat(T5, T6)=Vbe(T6) =Vcesat(T5), greater than Vbe, and thus the circuit is only active when Vc is less than or equal to Vbe.

Figure 7:
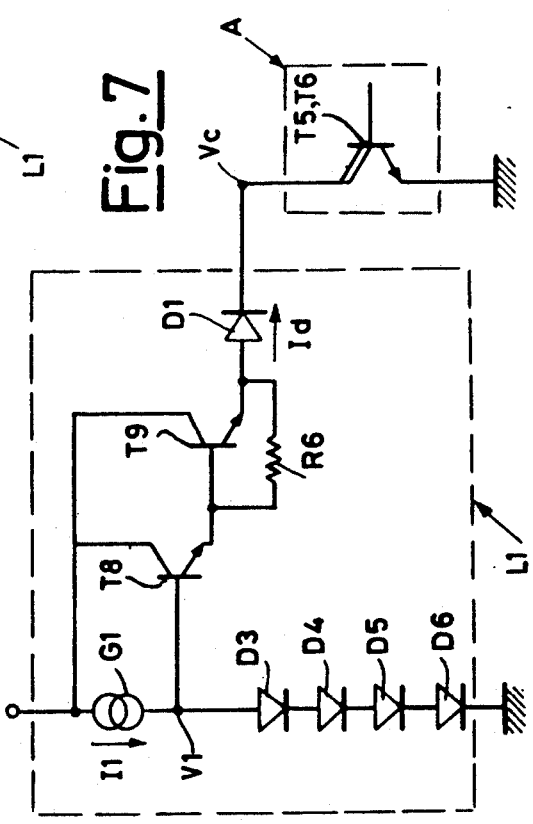

Using the same non-limiting criterion, of using Vbe as the threshold for Vc, it is possible to replace the circuit of FIG. 6 with that of FIG. 7. With reference to the limiting circuit L1, resistance R2 has been replaced by generator G1, transistor T13, resistance R3, transistor T7, diode D2 have been replaced by the single transistor T8.

In this case V1=4 Vbe. When Vc=V1−Vbe(T8)−−Vbe(T9) −Vbe(D1)=Vbe, there is the conduction of T8, T9, D1 which provide at the collector of darlington T5, T6 the current necessary to prevent Vc from falling below Vbe. It is necessary to select a current generator G1 of sufficient size to provide at least a current I1 greater than or equal to Id[hfe(T8)×hfe(T9)], where Id is the current provided at the darlington collector and hfe(T8), hfe(T9) the current gains of T8 and T9. Generator G1 may be replaced between Vs and V1 by a resistance having a value R=(Vs−V1)/I1.

Figure 8:
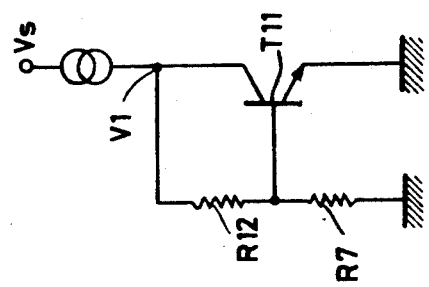

With reference to FIG. 8, in the circuits of FIGS. 6 and 7 it is possible to replace the diode chains D3, D4, D5 and D3, D4, D5, D6, with the series of a resistance R7 connected to ground, at one of its extremities, and at the other extremity connected to a resistance R12 which is connected to the node at a voltage V1, respectively. To the intermediate node between resistances R7, R12 there is connected the base of a transistor T11, whose emitter is connected to ground and whose collector is connected to the node V1. With this circuit solution there is obtained a variation of V1 that is continuous and not in multiples of Vbe, in particular V1=Vbe(T11)×(R12+R7)/R7 =KVbe.

If this modification is introduced into the circuit of FIG. 6, V1 must be greater than Vbe and less than 2 Vbe+Vsat(T5, T6) and thus the circuit according to the invention becomes consequently active when Vc is greater than −Vbe and less than Vsat(T5, T6). In the circuit of FIG. 7, applying the modification of FIG. 8 V1 is greater than 2Vbe and less than 3 Vbe+Vsat(T5, T6) and thus as a consequence the circuit of FIG. 7 becomes active when Vc is greater than −Vbe and less than Vsat(T5, T6).

Figure 9:
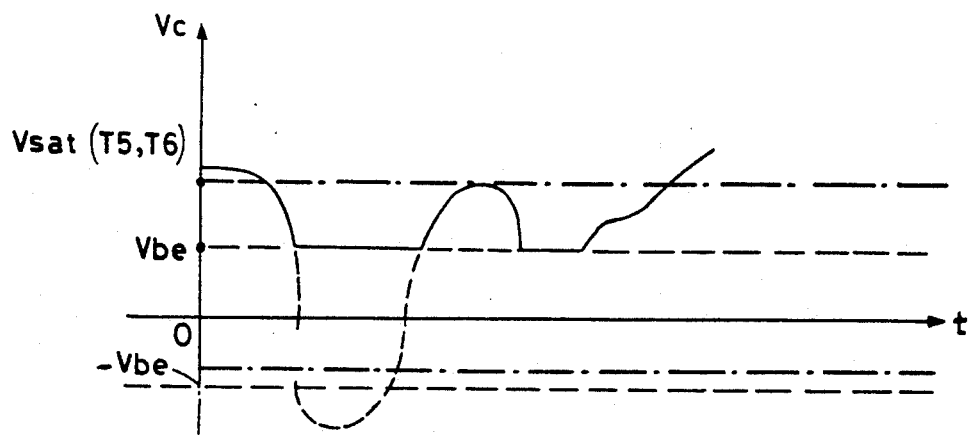
FIG. 9 shows the curve of the output voltage in the circuits illustrated in FIGS. 6, 7 and 8.

In the circuits of FIGS. 6, 7 the limitation of Vc thus occurs exclusively at two discrete values equal to Vbe and 0, while with the modification introduced in FIG. 8 Vc can be limited in a continuous manner, varying the values of R7 and R12, in an interval of values ranging from Vcesat(T5, T6) to −Vbe, excluding the extremes; this is shown in the graph of FIG. 9, where the thicker line refers to the preferred solution and the dotted lines indicate the upper and lower limits of such intervals of values.

The circuits of FIGS. 2, 4, 6, 7, 8, can be combined with a further circuit whose object is to enhance their action at time T2. Such additional circuit is driven in synchronization with the input signal Vi of FIG. 5 and has the object of keeping Vc above ground by a value greater than that obtained by the previous circuits, with the result of keeping the parasitic transistors T1, T2, T3 of FIG. 4 switched off.

Indeed, with reference to FIG. 3, the presence of transistor T4 entirely surrounded by region 11 of the pwell type in actual fact causes the formation of a further parasitic PNP transistor T21 whose base is obtained inside a region 14 of the n type, while the emitter is obtained inside a region 7, and the collector is connected to the bas of the parasitic transistor T1, region 11 of the p+well type.

When T4 is in saturation, transistor T21 injects a current into region 11 which closes itself to ground through a resistive path R20, region 11 of the pwell type, and raises the voltage at point S, that is, the base of T1. T1, which is normally enabled to conduct when a voltage greater than or equal to Vbe is present across its base, is also enabled to conduct when Vc is at a voltage greater than 0, in particular when Vc is greater than or equal to R20×I21−Vbe.

Figure 10:
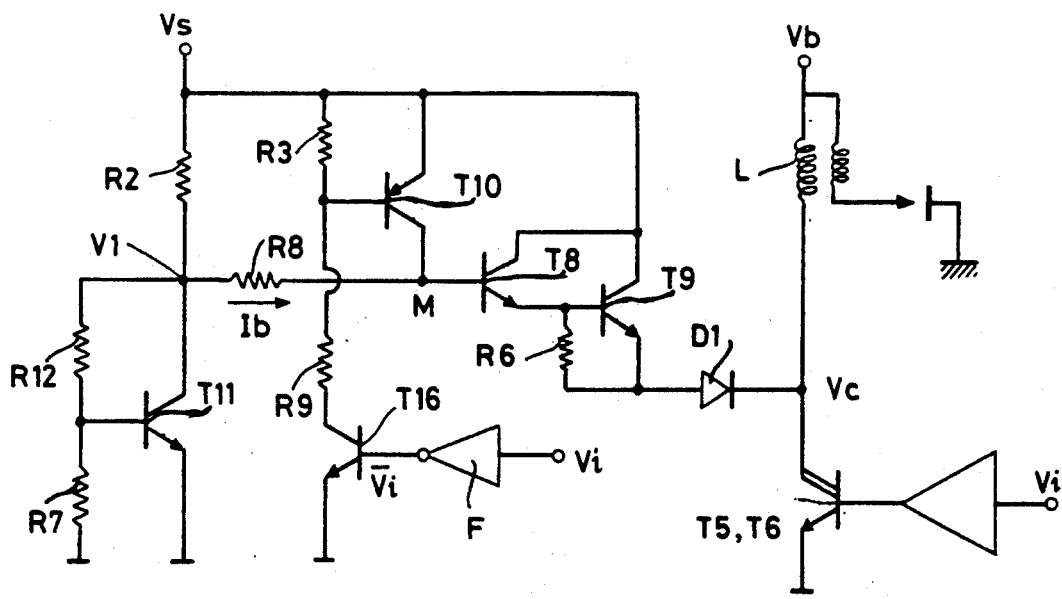
FIG. 10 illustrates a variant of the circuit of FIG. 7 with an enhanced action of the control circuit.

To overcome the presence of this second parasitic transistor, there is illustrated in FIG. 10 a circuit embodiment of a control circuit with an enhanced action on the collector of the power device. Such circuit differs from the circuit illustrated in FIG. 6 modified through FIG. 8. A transistor T16 is operated at the base by the output signal of a driver with inverter F which is supplied with the input signal. The emitter of transistor T16 is grounded, the collector is connected through a resistance R9 to the base of a transistor T10. The base of transistor T10 is connected to power supply Vs through a resistance R3, the emitter is connected directly to power supply Vs, the collector is connected to a node M which is connected on one side to the base of transistor T8 and on the other, through a resistor R8, to the node at voltage V1. The remaining part of the structure is unchanged with respect to that shown in FIG. 6.

As far as the operation of circuit of FIG. 10 is concerned, when Vi is high, there is as in the previous cases the tendency for Vc to have a voltage peak below ground. T16, driven by Vi through driver F, is switched off and thus T10, which is driven by T16 through R9, is also off. Moreover, the following obtains: V1−V8Ib−Vbe(T9)−V(D1)=Vc, since V1=KVbe where K=(R12+R7)/R7 is such that Vc is greater than or equal to 0.

As soon as Vc tends to fall below the value set by the latter equation, T8, T9 and D1 are activated injecting current on Vc to keep Vc at a constant voltage.

Similarly, when Vi goes to a low logic level, T5, T6 are switched off and T16 is activated which activates T10 through R9 which operates like a resistance to limit the current of T16. Transistor T10, of a suitable size, provides on node M a current of a few mA. Part of this current flows on R8 towards V1 and part flows to the base of T8. Node M rises in voltage to a voltage Vm=Vs−Vsat(T10), while a current coming from T10 which has a value (Vm−V1)R8 flows on R8. The remaining portion of the collector current of T10 which flows on the base of T8 must be of a value (say, 1 or 2 mA) so as to suitably drive T8 and T9, so that there is a current flowing through D1 sufficient to take Vc to a value Vc=Vs−Vcesat(T10)−Vbe(T8)−Vbe(T9)−V(D1). Obviously Vs must be such that the above equation is always greater than zero.

In FIG. 10 resistance R2 can be replaced by a current generator between terminal Vs and V1.

Comparing the last two equations of Vc shown, it is seen that in the second equation Vc is greater than in the first equation if the condition is satisfied that Vs is greater than V1+Vsat(T10), where the term R8Ib has been ignored since it is negligible.

This latter equation is normally satisfied being V1=4 Vbe=2.8 V, Vsat(T10)=0.2 V, replacing in the last equation it is seen that Vs is greater than 3 V. Generally Vsmin=5 V.

In the case of FIG. 7 Vc=Vbe approximately equal to 0.7 V, in the case of FIG. 10 with a simple substitution in the last equation of Vc it i seen that Vc=5 V−0.2 V−0.7 V−0.7 V−0.7 V=2.7 V, and thus the margin to prevent Vc from falling below ground is raised and parasitic transistors T1, T2, T3 of FIG. 3 from being switched on.

Figure 11:
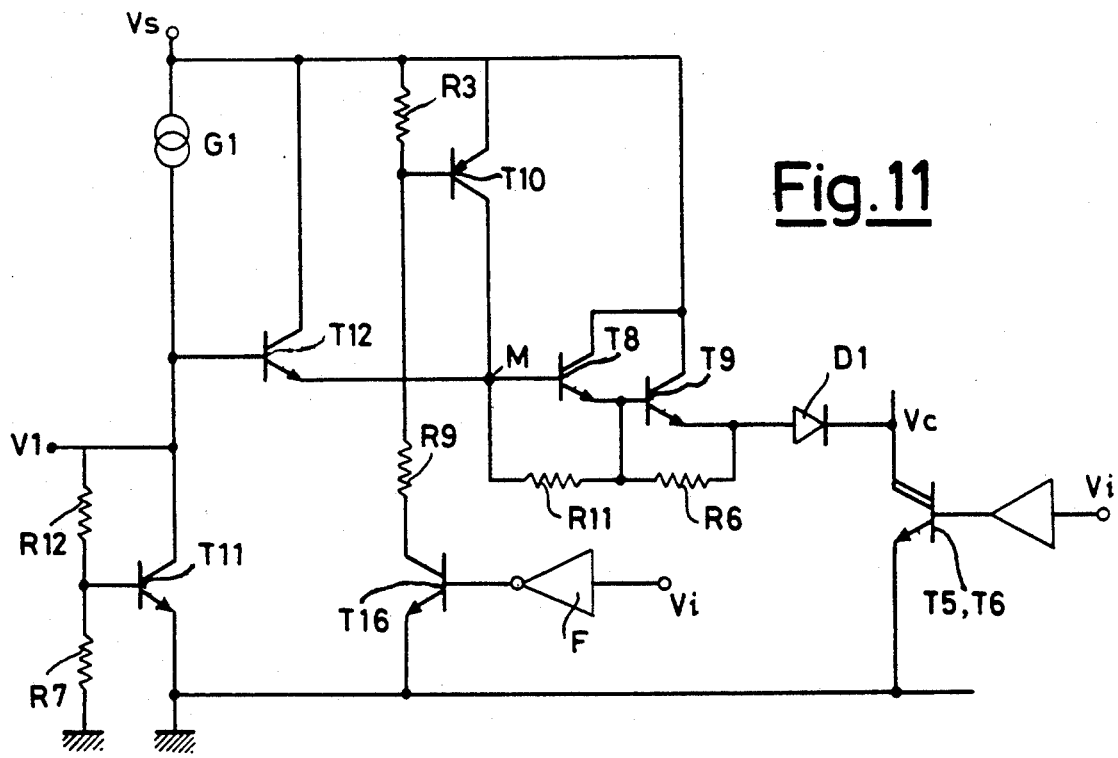
FIG. 11 illustrates a variant of the circuit shown in FIG. 10 wherein a transistor T12 has been introduced to replace resistance R8, and a current generator G1 has replaced resistance R2.

With reference to FIG. 11, it is possible to obtain a current saving of T10 by replacing resistor R8 with a transistor T12 and the resistor R2 with a current generator G1. Such current saving derives from the fact that the entire current coming from T10 flows to the base of T8 since the passage of current towards V1 is prevented by the base emitter junction of T12 which is inversely biassed. In addition, the current of G1 can also be very low since to activate Vc it is multiplied by the current gain hfe(T12), hfe(T8), hfe(T9) of transistors T12, T8, T9. This circuit also has a resistance R11 connected between the emitter and the base of transistor T8.

As an alternative to transistor T12 it is possible to use a diode having the cathode connected to node M and the anode connected to terminal V1. In this case the current G1 must be hfe times the current of G1 in the circuit shown in FIG. 11.

Figure 12:
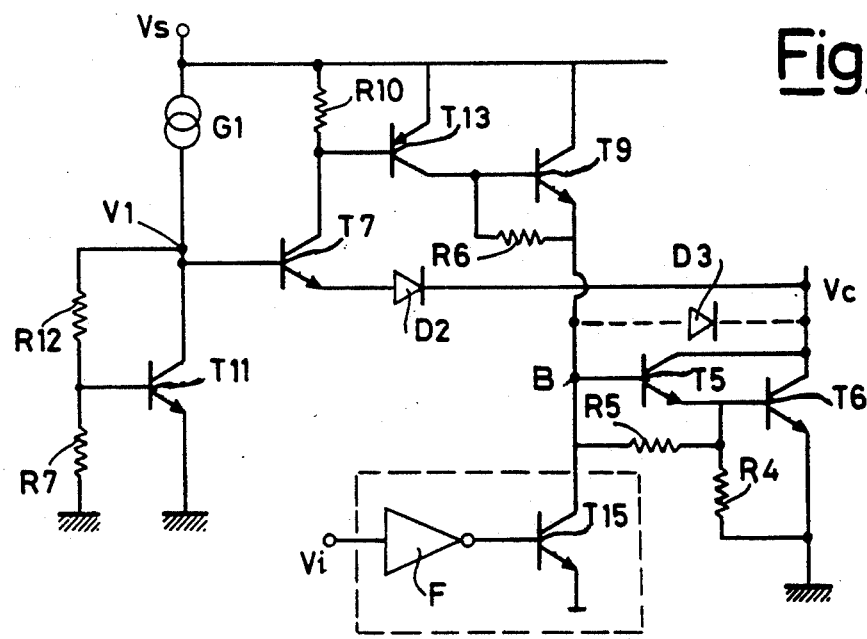
FIG. 12 illustrates a variant of the circuit shown in FIG. 11.

With reference to FIG. 12, it is possible to avoid the use of the high voltage diode D1 in the previous circuits by injecting a current in the base of the power darlington T5, T6 when the collector current Vc tends to fall below ground. In such a circuit diagram the position is unchanged of the voltage divider T11, T12, R7 connected to the node V1 of generator G1, of transistor T9 with its resistance R6, of the power device T5, T6. At the base of transistor T9 there is connected the collector of transistor T13, whose emitter is connected to the power supply Vs, whose base is connected on one side to the power supply Vs through a resistance R10, on the other to the collector of transistor T7. The base of transistor T7 is connected to node V1, the emitter is connected, through a diode D2, to the collector of the power device T5, T6. It is possible to consider the structure of the power darlington T5, T6 as comprising an intrinsic diode D5 between base and collector. Once the voltage V1 is set by the criterion V1=Vbe(T7)+V(D2)+Vc, since Vc is greater than −Vbe and less than the base voltage of the power darlington T5, T6, as long as Vc is greater than V1−Vbe(T7)+V(D2), T7 remains switched off. When Vc is less than V1−Vbe(T)−V(D2), transistor T7 is switched on and activates T13 which in turn activates T9 which injects current on the base of the darlington T5, T6. At this point the intrinsic diode D3 comes into conduction which sends current on Vc preventing the occurrence of negative peaks.

In using this circuit it is necessary to bear in mind that when Vi is at a low logic level, there may be active a transistor T15 which forms part of driver F for supplying power to the base of darlington T5, T6, to absorb all the current coming from T9. To overcome this problem it is possible to introduce downstream from driver F a diode or decoupling resistance. The result is thus obtained of limiting voltage Vc to the value Vbe.

Figure 13:
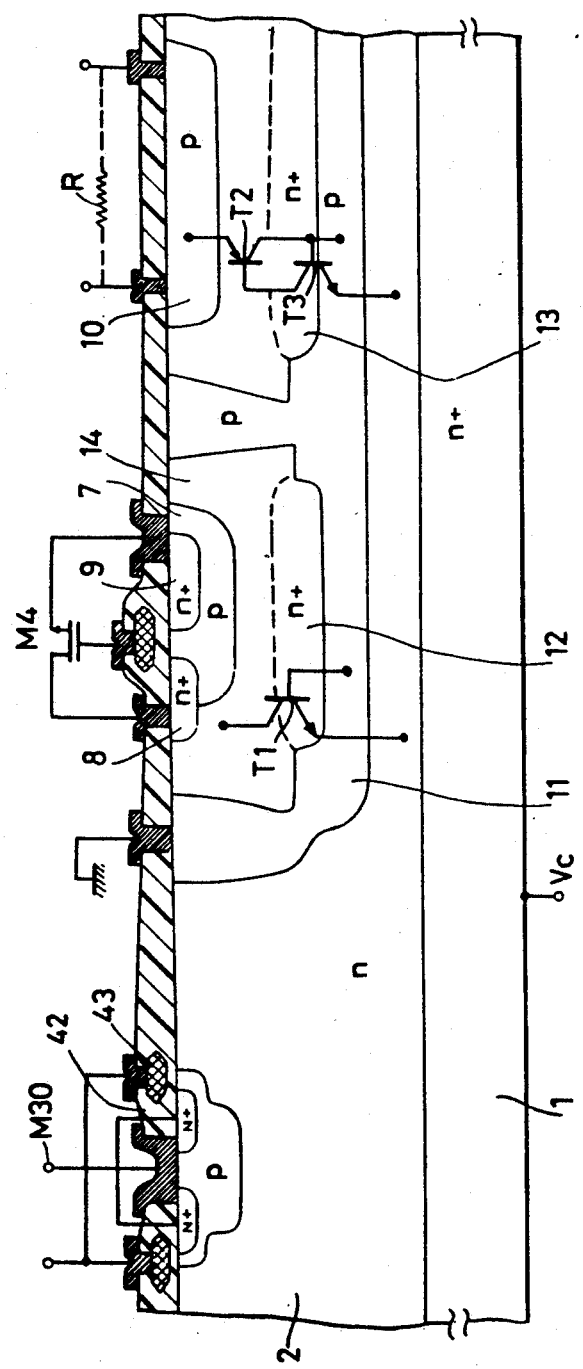
FIG. 13 illustrates a variant of FIG. 3 accomplished in MOS Technology.

The circuits according to the invention previously described may be accomplished with components of the MOS type or of the mixed type (bipolar+MOS) and they can be integrated in the structure shown in FIG. 13. In this case the power darlington T5, T6 is replaced by a power MOS transistor, indicated in FIG. 13 with 30 whose gate is accomplished at polysilicon strips 43 while the source is accomplished in regions 42 of the type $n^1$ and the drain is accomplished in the substrate, region 2 of type n; the components of the control circuit are also of the MOS type, such as, say, M4, or they may be of the mixed type. The same reference numbers of FIG. 3 are used in FIG. 13 to indicate corresponding parts.

Figure 14:
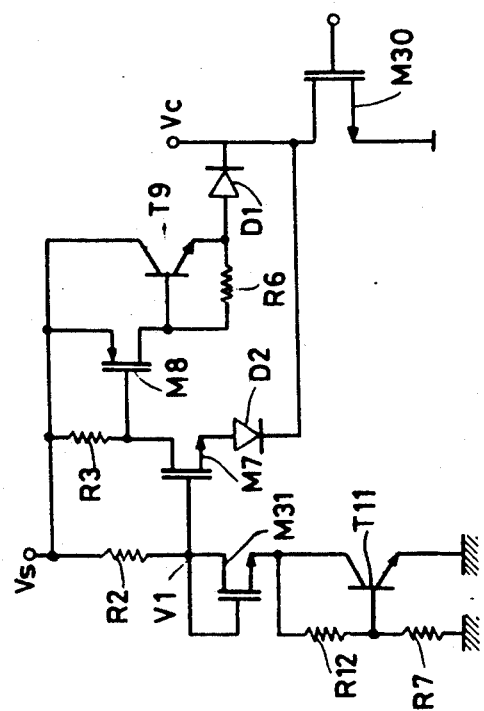
FIGS. 14, 15 and 16 illustrate possible circuit embodiments of the above power device with a control circuit and a limiting circuit.

There is represented in FIG. 14 a circuit embodiment of the mixed type of the circuit illustrated in FIG. 6 with the variant of the voltage divider illustrated in FIG. 8. The bipolar transistors T13, T7 have been replaced here with MOS transistors M8, M7, an MOS transistor M31 has been introduced whose drain is connected to node V1, while the source is connected to the collector of transistor T11 and the gate is connected to the drain and thus to node V1; in addition, the power darlington T5, T6 has been replaced by the MOS power transistor M30.

Figure 15:
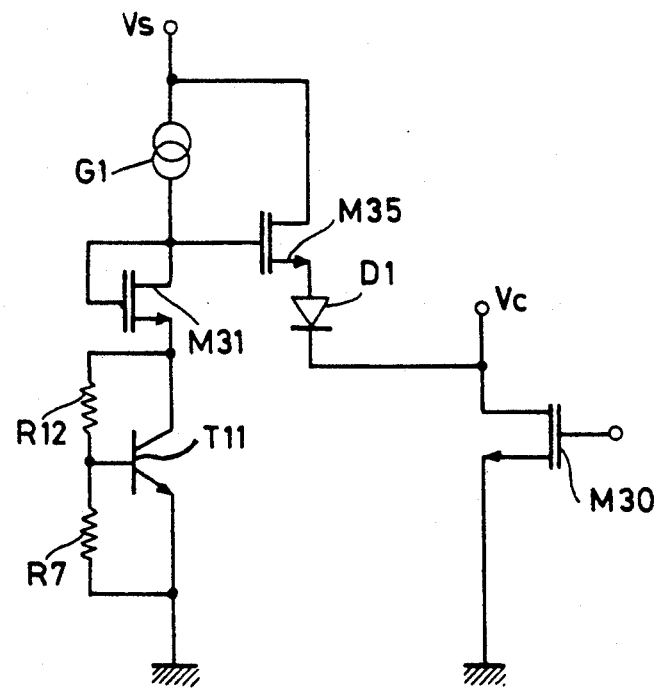

There is represented in FIG. 15 a circuit embodiment of the mixed type of the circuit illustrated in FIG. 7 with the variant introduced in FIG. 8. In this circuit, in addition to the modifications already introduced in FIG. 7, there is an MOS transistor M35 which replaces the bipolar transistors T8, T9 and the resistor R6.

Figure 16:
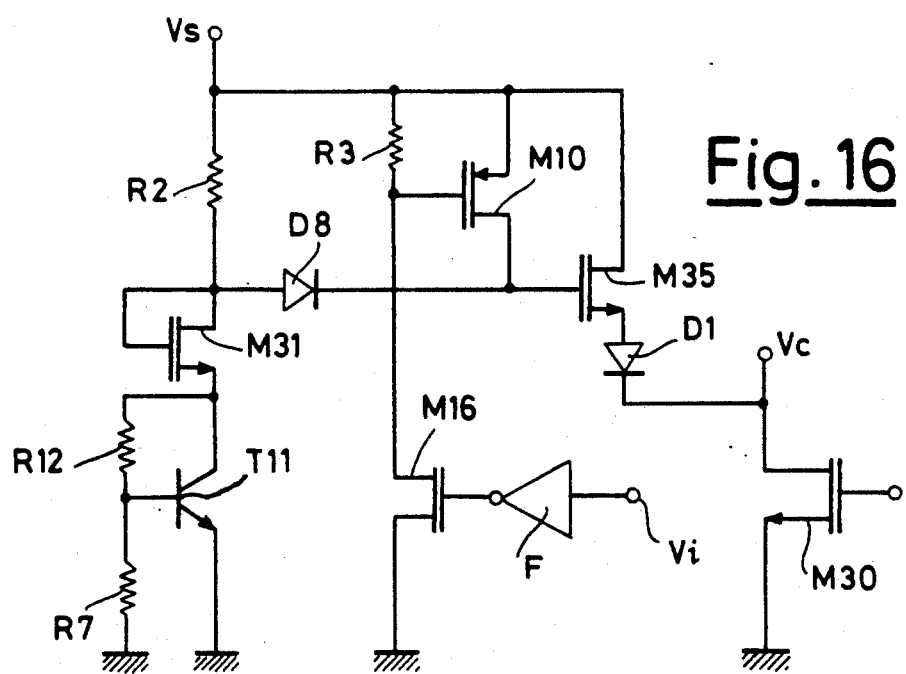

There is represented in FIG. 16 a circuit embodiment of the mixed type of the circuit illustrated in FIG. 10. In addition to the replacements with MOS type components already made in the circuits of FIGS. 14, 15, this circuit has an MOS transistor M10 which replaces the bipolar transistor T10 and a diode D8 to replace resistance R8.

The ode of operation of the circuits shown in FIGS. 14, 15, 16 is that already illustrated earlier with reference to the equivalent circuits in a bipolar accomplishment shown in FIGS. 6, 7, 10.

We claim:

1. An output voltage limiting circuit for a monolithic semiconductor power device having an input terminal controlled by an input signal and an output terminal for controlling a resonant load, comprising a comparator for comparing an output voltage at said output terminal of the power device with a predetermined reference voltage and for supplying current to the load when said output voltage becomes lower than said reference voltage so as to maintain said output voltage substantially equal to said reference voltage, and diode means interposed between said output terminal and the comparator to protect the comparator against output overvoltage of the power device, wherein said comparator comprises a first bipolar transistor having a first terminal connected to a voltage supply, a second terminal connected to said output terminal of the power device through first diode means and a control terminal connected to a source of said reference voltage, a second bipolar transistor having a first terminal connected to a voltage supply and a second terminal connected to said output terminal of the power device through second diode means, and a third bipolar transistor operatively interposed between the first terminal of the first transistor and a control terminal of the second transistor to cause switching on of the second transistor simultaneously with switching on of the first transistor as caused by lowering of the output voltage of the power device under said reference voltage.

2. A circuit according to claim 1, wherein sad source of reference voltage consists of a voltage divider having an intermediate node connected to the control terminal of said first transistor, said voltage divider including a plurality of serially connected diodes interposed between said intermediate node and ground.

3. A circuit according to claim 1, wherein said source of reference voltage consists of a voltage divider having an intermediate node connected to the control terminal of said first transistor, said voltage divider including a bipolar transistor interposed between said intermediate node and ground and having a control terminal resistively connected to said intermediate node and ground.

4. An output voltage limiting circuit for a monolithic semiconductor power device having an input terminal controlled by an input signal and an output terminal for controlling a resonant load, comprising a comparator for comparing an output voltage at said output terminal of the power device with a predetermined reference voltage and for supplying current to the load when said output voltage becomes lower than said reference voltage so as to maintain said output voltage substantially equal to said reference voltage, and diode means interposed between said output terminal and the comparator to protect the comparator against output overvoltage of the power device, wherein said comparator comprises first and second bipolar transistor each having a first terminal connected to a voltage supply, a second terminal connected to said output terminal of to the power device through diode means and a control terminal, the control terminal of the first transistor being connected to a source of said reference voltage and the control terminal of the second transistor being connected to the second terminal of the first transistor so to cause switching on of the second transistor simultaneously with switching on of the first transistor as caused by lowering of the output voltage of the power device under said reference voltage.

5. A circuit according to claim 4, wherein said source of reference voltage consists of a voltage divider having an intermediate node connected to the control terminal of said first transistor, said voltage divider including a plurality of serially connected diodes interposed between said intermediate node and ground.

6. A circuit according to claim 4, wherein said source of reference voltage consists of a voltage divider having an intermediate node connected to the control terminal of said first transistor, said voltage divider including a bipolar transistor interposed between said intermediate node and ground and having a control terminal resistively connected to said intermediate node and ground.

7. A circuit according to claim 4, wherein said control terminal of the first transistor is resistively connected to said source of reference voltage and further directly connected to said voltage supply through a supplemental bipolar transistor having a control terminal controlled by a further bipolar transistor having a control terminal controlled by said input signal of the power device.

8. A circuit according to claim 4, wherein said control terminal of the first transistor is connected to a first terminal of an additional bipolar transistor having a second terminal connected to said voltage supply and a control terminal connected to said source of reference voltage and is further directly connected to said voltage supply through a supplemental bipolar transistor having a control terminal controlled by a further bipolar transistor having a control terminal controlled by said input signal of the power device.

9. An output voltage limiting circuit for a monolithic semiconductor power device having an input terminal controlled by an input signal and an output terminal for controlling a resonant load, comprising a comparator for comparing an output voltage at said output terminal of the power device with a predetermined reference voltage and for supplying current to the load when said output voltage becomes lower than said reference voltage so as to maintain said output voltage substantially equal to said reference voltage, and diode means interposed between said output terminal and the comparator to protect the comparator against output overvoltage of the power device, wherein said comparator comprises a first MOS transistor having a first terminal connected to a voltage supply, a second terminal connected to said output terminal of the power device through first diode means and a control terminal connected to a source of said reference voltage, a bipolar transistor having a first terminal connected to a voltage supply and a second terminal connected to said output terminal of the power device through second diode means, and a second MOS transistor operatively interposed between the first terminal of the first MOS transistor and a control terminal of the bipolar transistor to cause switching on of the bipolar transistor simultaneously with switching on of the first MOS transistor as caused by lowering of the output voltage of the power device under said reference voltage.

10. A circuit according to claim 9, wherein said source of reference voltage consists of a voltage divider having an intermediate node connected to the control terminal of said first MOS transistor, said voltage divider including a series of a third MOS transistor and of a bipolar transistor having a control terminal resistively connected to said third MOS transistor and ground.

11. An output voltage limiting circuit for a monolithic semiconductor power device having an input terminal controlled by an input signal and an output terminal for controlling a resonant load, comprising a comparator for comparing an output voltage at said output terminal of the power device with a predetermined reference voltage and for supplying current to the load when said output voltage becomes lower than said reference voltage so as to maintain said output voltage substantially equal to said reference voltage, and diode means interposed between said output terminal and the comparator to protect the comparator against output overvoltage of the power device, wherein said comparator comprises MOS transistor having a first terminal connected to a voltage supply, a second terminal connected to said output terminal of the power device through diode means and a control terminal connected to a source of said reference voltage so that lowering of the output voltage of the power drive under said reference voltage causes switching on of the MOS transistor.

12. A circuit according to claim 11, wherein said control terminal of the MOS transistor is connected to said source of reference signal through further diode means and is also connected to said voltage supply through a supplemental MOS transistor having a control terminal controlled by an additional MOS transistor having a control terminal controlled by said input signal of the power device.

13. A circuit according to claim 11, wherein said source of reference voltage consists of a voltage divider having an intermediate node connected to the control terminal of said MOS transistor, said voltage divider including a series of a further MOS transistor and of a bipolar transistor having a control terminal resistively connected to said further MOS transistor and ground.

14. An output voltage limiting circuit for a monolithic semiconductor power device having an input terminal controlled by an input signal and an output terminal for controlling a resonant load, comprising a comparator for comparing an output voltage at said output terminal of the power device with a predetermined reference voltage and for injecting current into the input terminal of the power device when said output voltage becomes lower than said reference voltage so as to maintain said output voltage substantially equal to said reference voltage, and diode means interposed between said output terminal and the comparator to protect the comparator against output overvoltage of the power device, wherein said comparator comprises a first bipolar transistor having a first terminal connected to a voltage supply, a second terminal connected to said output terminal of the power device through diode means and a control terminal connected to a source of said reference voltage, a second bipolar transistor having a first terminal connected to a voltage supply and a second terminal connected to said input terminal of the power device, and a third bipolar transistor operatively interposed between the first terminal of the first transistor and a control terminal of the second transistor to cause switching on of the the second transistor simultaneously with switching on of the first transistor as caused by lowering of the output voltage of the power device under said reference voltage, said second terminal of the second transistor being further connected to ground by a further bipolar transistor having a control terminal controlled by said input signal of the power device.

15. A circuit according to claim 14 wherein said source of reference voltage consists of a voltage divider having an intermediate node connected to the control terminal of said first transistor, said voltage divider including a bipolar transistor interposed between said intermediate node and ground and having a control terminal resistively connected to said intermediate node and ground.

* * * * *